(12) United States Patent
Capewell

(10) Patent No.: US 6,974,168 B2
(45) Date of Patent: Dec. 13, 2005

(54) SYSTEM AND METHOD FOR PERFORMING SIMULTANEOUS PRECISION DIE BOND OF PHOTONIC COMPONENTS ONTO A SINGLE SUBSTRATE

(75) Inventor: Dale L. Capewell, Agoura Hills, CA (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 10/260,792

(22) Filed: Sep. 30, 2002

(65) Prior Publication Data

US 2004/0061346 A1  Apr. 1, 2004

(51) Int. Cl.[7] .............................................. B25J 15/06
(52) U.S. Cl. .................... 294/64.1; 294/907; 294/87.1; 29/743; 901/40; 901/47
(58) Field of Search .............................. 294/64.1–64.3, 294/65, 907, 87.1; 901/40, 47; 414/627, 414/737, 752.1, 941; 29/743

(56) References Cited

U.S. PATENT DOCUMENTS 4,787,662 A * 11/1988 Dewez ...................... 294/64.1
4,881,319 A    11/1989 Kenichi et al. ................ 29/840
5,033,783 A *  7/1991 Izumi et al. ................ 294/64.1
5,290,081 A *  3/1994 Ogura ........................ 294/64.1
5,590,456 A *  1/1997 Armington et al. ........... 29/721
6,203,082 B1 * 3/2001 Bendat et al. .............. 294/64.1

FOREIGN PATENT DOCUMENTS

EP    0 360 985 A2    4/1990
WO      01/03893      1/2001

* cited by examiner

Primary Examiner—Dean J. Kramer
(74) Attorney, Agent, or Firm—Pillsbury Winthrop Shaw Pittman LLP

(57) ABSTRACT

Embodiments of the present invention overcome the disadvantages of the metal bond head systems while also providing a method for performing precision die bond of multiple die at once. A mounting system is adapted for simultaneous high accuracy placement of multiple semiconductor components or dies on substrates. Simultaneous high accuracy multiple die placement is achieved by providing a mounting head assembly, including a see-through (ST) bond head with selectively and independently controlled gripping mechanisms, with moving and/or adjusting mechanisms adapted for accurate alignment of semiconductor components relative to a substrate in all directions.

20 Claims, 12 Drawing Sheets

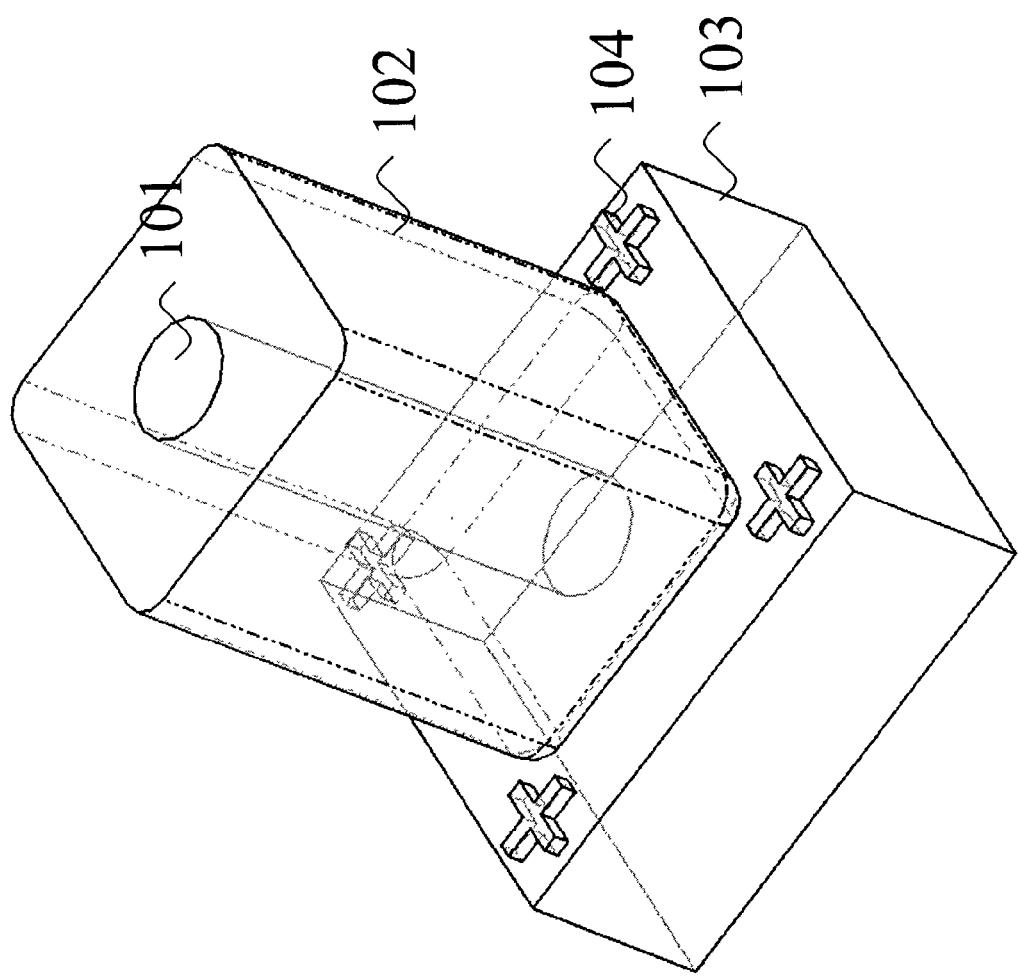
Figure 1: Prior Art

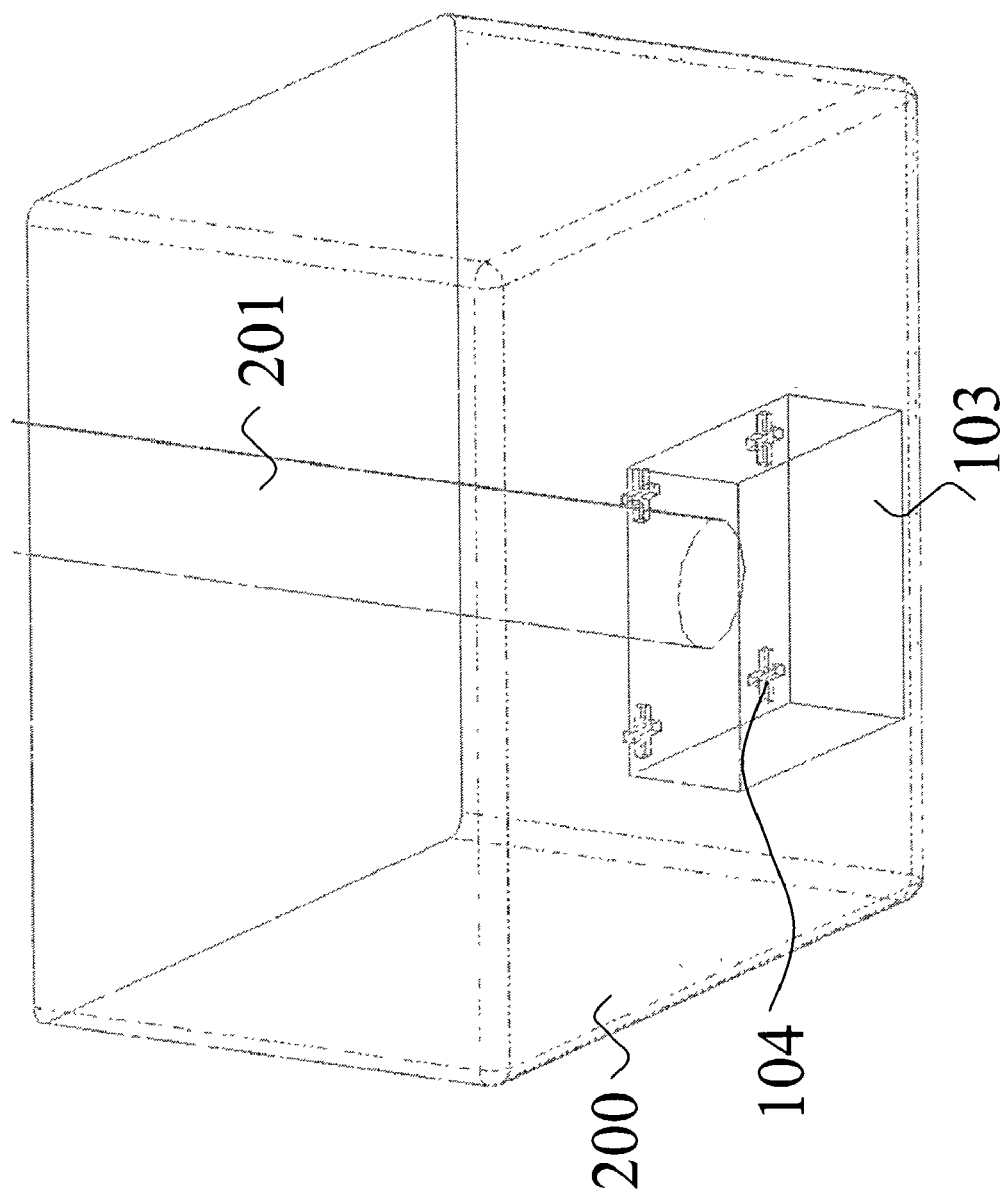
Figure 2: Prior Art

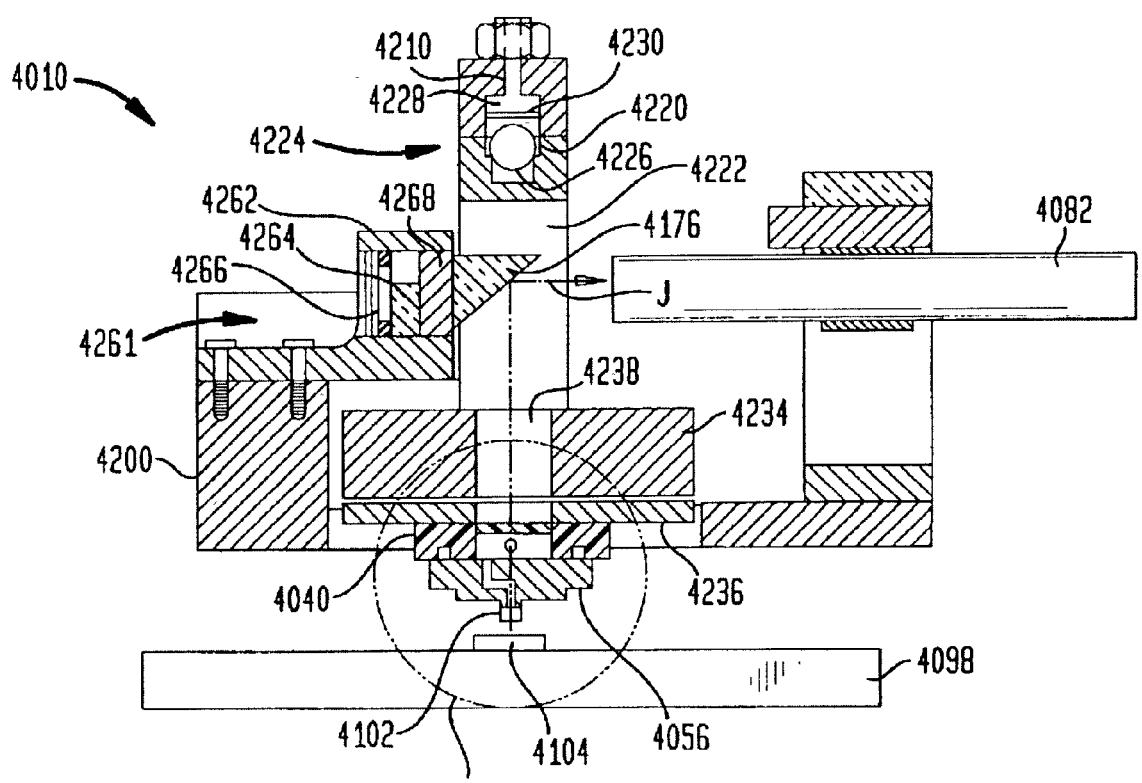
Figure 3A: Prior Art

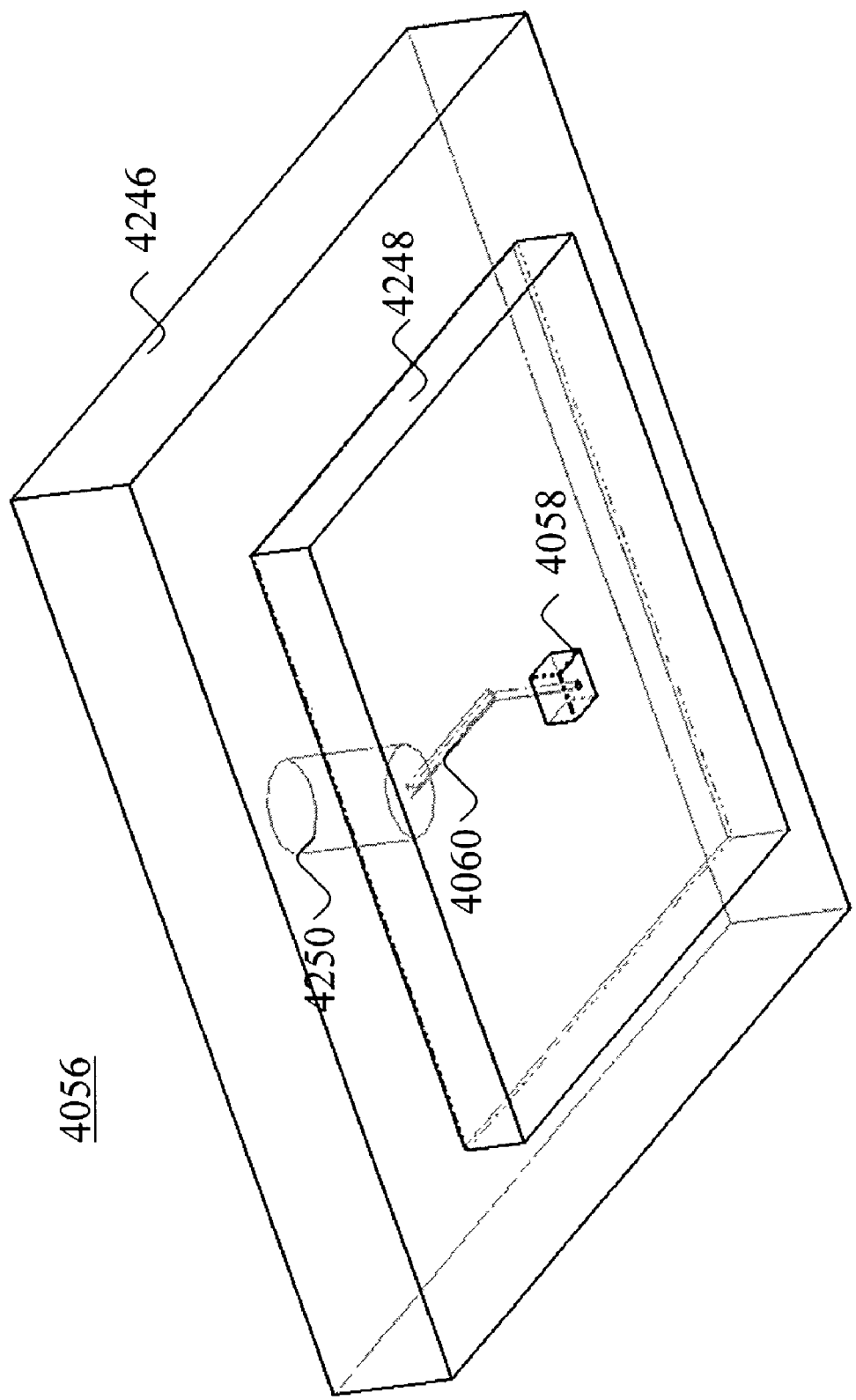
Figure 3B: Prior Art

SYSTEM AND METHOD FOR PERFORMING SIMULTANEOUS PRECISION DIE BOND OF PHOTONIC COMPONENTS ONTO A SINGLE SUBSTRATE

BACKGROUND OF THE INVENTION

1. Technical Field

The present invention relates to a mounting apparatus and method for mounting semiconductor components, more particularly, to a mounting apparatus and method for mounting photonic components in die form on substrates with high positional accuracy.

2. Discussion of the Related Art

Efforts to perfect precise positioning of small semiconductor devices onto a substrate have received considerable attention over the past few years. Tools for this purpose generally employ a digital camera, machine vision software, and stepper motors with encoders capable of sub-micron resolution in motion control. FIG. 1 illustrates a prior art metal bond head 100 with a single vacuum hole 101 typically used to lift a die 103 from its center. In order to leave the fiducials 104 of the die 103 exposed for viewing by a digital camera, this bond head 100 must be significantly smaller than the die 103. The position of the die fiducials 104, obtained with sub-micron precision using pattern recognition software, are compared to the position of fiducials on a substrate. This information is used to determine how far the stepper motors must move to accurately position the die 103 on the substrate. Once positioned, epoxy is used to attach the die 103 to the substrate and the epoxy is cured.

For extremely small die, e.g. 200–300 micron on edge, use of a metal bond head is problematic because of the requirement that the bond head be much smaller than the die so that the fiducials remain exposed. One example of a prior approach uses a see-through (ST) bond head 200 made of glass which solves this problem (see FIG. 2). The ST bond head 200 in this case allows a downward viewing camera to see the fiducials 104 while simultaneously keeping the bond head 200 larger than the die 103. The restriction on this head is less severe because only the vacuum hole 201 must be much smaller than the die 103, not the entire bond head 200.

For instance, U.S. Pat. Nos. 5,018,936 and 5,033,783 disclose one type of mounting apparatus equipped with a mounting head, which is provided with a suction nozzle assembly at one end thereof, and a recognition camera, which is mounted above the mounting head opposite the suction nozzle assembly. The suction nozzle assembly is adapted to pick up electronic parts and is made from a light transmitting material such that the picked-up parts can be viewed by the camera through the suction nozzle assembly for determining their shape and position. In this manner, the mounting apparatus eliminates the need to provide a camera adapted to be positioned below the suction nozzle assembly for viewing the images of the picked-up parts.

The mounting apparatus described above has various shortcomings and disadvantages. For instance, the mounting apparatus is not adapted for precise placement of microscopic objects, such as semiconductor components, on other objects (e.g., such as substrates). Moreover, because the camera is not incorporated into the mounting head, the camera needs to be mounted to the mounting apparatus separately from the mounting head, thereby requiring an additional effort to mount the camera to the mounting apparatus and then to align the camera with the mounting head. Further, because the suction nozzle assembly is mounted to the mounting head via a retainer member, detachment of the suction nozzle assembly from the mounting head involves removal of the retainer member from the suction nozzle assembly.

U.S. Pat. No. 6,203,082 to Bendat, et al. addresses some of the disadvantages and shortcomings of the method discussed above by providing an improved mounting apparatus for serially picking up and precisely placing microscopic devices, such as semiconductor devices and optoelectronic dies, to other semiconductor devices (e.g., substrates). Referring to FIGS. 3A and 3B, the mounting apparatus 4010 includes a mounting head 4200 with an attached upper chuck 4056 and a suction-operated engagement nozzle 4058 for selectively gripping a semiconductor component or die positioned adjacent one side of the engagement nozzle 4058. A suction-operated attaching mechanism is also provided for selectively and removeably attaching the upper chuck 4056 to the mounting head 4200 of the mounting apparatus 4010, whereby the upper chuck 4056 is removable from the mounting head 4200 and is hence replaceable. The mounting apparatus 4010 also has a viewing mechanism, including a camera 4082, for viewing an object gripped by the engagement nozzle 4058. The camera 4082 is located in a horizontal plane and utilizes a mirror 4176 to look down on the engagement nozzle 4058. The upper chuck 4056 has a light-transmitting portion positioned in such a manner that an object gripped by the engagement nozzle 4058 may be viewed by the camera 4082 through the upper chuck 4056.

While the various mounting apparatus described above overcomes the disadvantages of using a metal bond head, they do not address the problem of placing several die at once with high precision. The mounting apparatus described above place die serially, one die at a time, i.e., aligning the bond head with die, moving from the die storage location to the substrate, dispensing epoxy, placing the die, and curing the epoxy for each die placed. However, if all the die could be loaded onto the bond head with high precision, placed in one step, and epoxy cured in one step, a significant time savings would be realized. This is especially true if each die must be aligned accurately relative to fiducials on the other die. By putting multiple fiducials on a see-through bond head containing multiple individually controllable suction nozzles, several die may be picked up with high precision onto the bond head, moved to the substrate, and placed with high precision in a single step.

BRIEF DESCRIPTION OF THE DRAWINGS

FIG. 1 illustrates a view of a prior art metal bond head;

FIG. 2 illustrates a view of a prior art glass see-through bond head;

FIG. 3A illustrates a view of a prior art mounting apparatus;

FIG. 3B illustrates a view of a prior art see-through glass plate with a vacuum hole which is off-axis from the vacuum hole in the bond head, and attached engagement nozzle;

DETAILED DESCRIPTION

Figure 4:
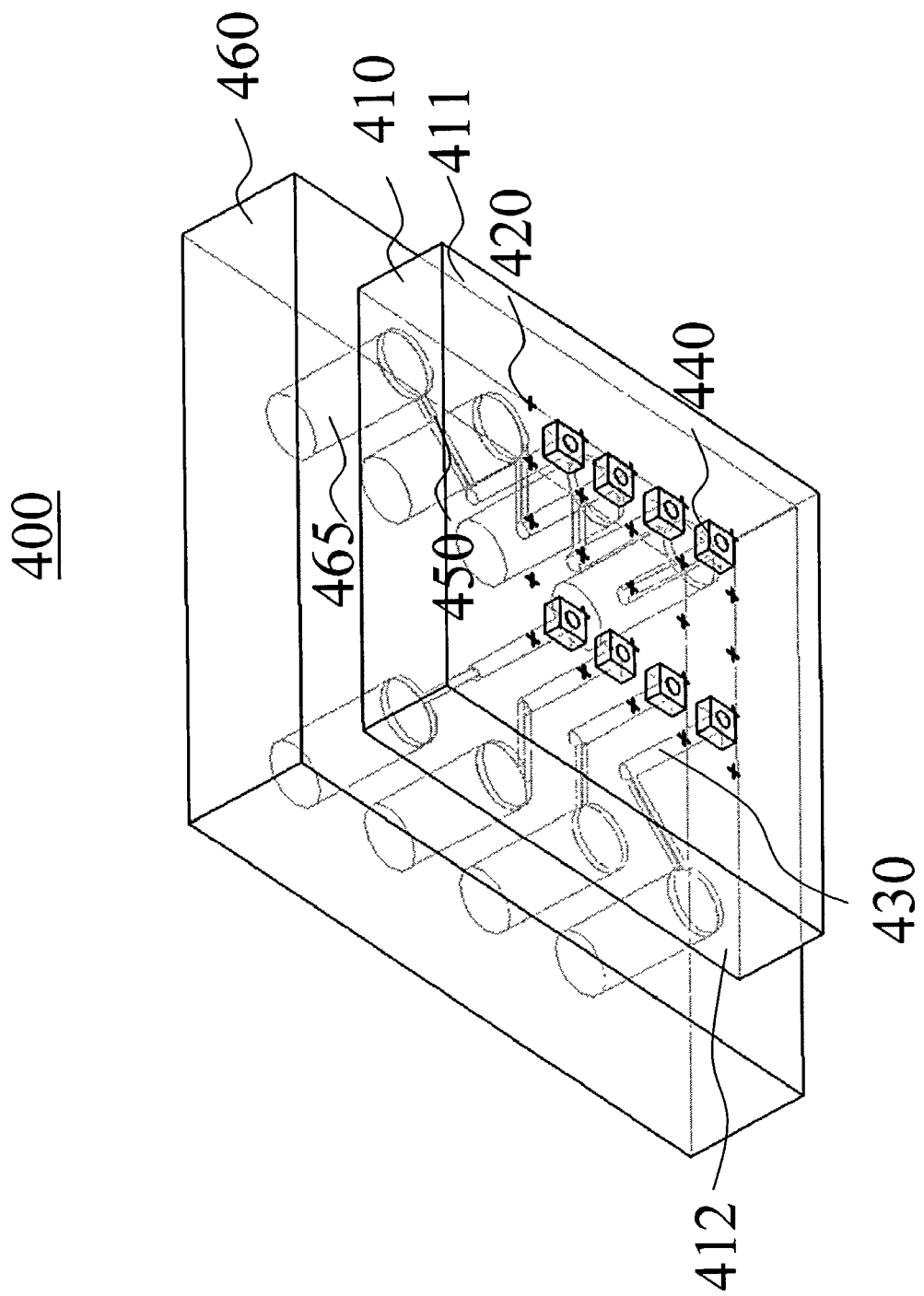
FIG. 4 illustrates a see-through bond head with attached gripping mechanisms suitable for picking and placing several photonic components onto a single substrate according to an embodiment of the present invention.

Interest in placement of photonic components (e.g. edge emitting lasers, vertical cavity surface emitting lasers, photodiodes) in die form onto substrates with high positional accuracy is of growing importance in the optical telecommunications industry. The present invention provides a method whereby multiple photonic components may be aligned relative to each other, and then placed and bonded onto a substrate so as to preserve their relative positions with high precision. Such a need may arise, for example, in a course wavelength division multiplexing (CWDM) system where lasers of different wavelength must be coupled individually into a linear array of optical fibers, or into lenses which ultimately couple light into a linear array of optical fibers. The method is a significant improvement over the alternative serial placement procedure required when using prior techniques, especially when the number of photonic components is large.

Embodiments of the present invention overcome the disadvantages of the metal bond head systems while also providing a method for performing precision die bond of multiple die at once. A mounting system is adapted for simultaneous high accuracy placement of multiple semiconductor components or dies on substrates. For instance, simultaneous high accuracy multiple die placement is achieved by providing a mounting head assembly, including a see-through (ST) bond head with gripping mechanisms, with moving and/or adjusting mechanisms adapted for accurate alignment of semiconductor components relative to a substrate in all directions (i.e., X, Y, Z and theta directions). In this regard, the moving and adjusting mechanisms include an X-Y stage adapted to support thereon a substrate and adapted to move relative to the mounting head assembly in the X and Y directions, thereby eliminating the need to move the mounting head assembly in the X and Y directions after picking up a semiconductor component and hence minimizing inadvertent movement of the semiconductor component.

A viewing mechanism also facilitates simultaneous high accuracy multiple die placement. More particularly, the viewing mechanism, including two cameras and an optical probe, is adapted for simultaneously or sequentially viewing (i.e., identifying) fiducial marks or other repeatable patterns on semiconductor components and on substrates. Fiducial marks can be viewed or identified by the two cameras each with a single field of view or multiple fields of view. For instance, highly accurate die placement requires high powered magnification for a camera, causing the field of view of the camera to decrease. An adjustment mechanism is provided for the viewing mechanism for adjusting the position of the optical probe relative to the cameras in the X, Y and Z directions. In this manner, when one or more fiducial marks lies outside of the field of view of either camera, the position of the optical probe relative to the cameras can be adjusted during die placement to bring such fiducial marks into the field of view of each camera. The mounting system can also include a rotatable mechanism for adjusting, if necessary, the angular orientation of a semiconductor component relative to the cameras.

A method for implementing embodiments of the present invention includes a loading procedure, using a camera mounted in a horizontal plane to provide a simultaneous upward and downward view, whereby several die are serially lifted with high precision onto a see-through bond head using a technique similar to that used with flip-chip style bonders. A placement procedure whereby all the die are placed and attached to a substrate in a single step using a vertically mounted camera to provide downward viewing. A curing procedure is also used, whereby an ultra violet (UV) sensitive epoxy is partially cured by transmitting UV light through the bond head onto the array of die while being held in place by the bond head. The bond head is then lifted, leaving the array of die positioned with high precision on the substrate.

FIG. 4 illustrates a ST bond head suitable for serially picking and simultaneously placing several components onto a single substrate according to embodiments of the present invention. ST bond head 400 includes a chuck 410 made of a material which is transparent in both the UV (e.g. 300–400 nm) and the visible regions of the electromagnetic spectrum. Chuck 410 may have a pattern of fiducials 420 (alignment marks) on a first surface 411. The fiducials 420 may, for example, consist of a metal such as gold or aluminum, deposited using sputtering or evaporation and then patterned using common lift-off or etching techniques. The pattern of fiducials 420 may be a one or two dimensional array or any other arbitrary pattern.

The chuck 410 also has a plurality of holes therein which serve as first vacuum holes 430. These vacuum holes 430 may be made using etching or laser drilling techniques. Aligned with this pattern of vacuum holes 430 is a pattern of gripping mechanisms 440 which provide a mechanism by which a pattern of e.g., photonic components may be lifted and placed onto a substrate. Each individual gripping mechanism 440 has an associated vacuum channel 450 etched on a second surface 412 of chuck 410 and a second vacuum hole 465, located in a vacuum transfer plate 460. The vacuum channels 450 and second vacuum holes 465 function together to provide vacuum paths away from the first vacuum holes 430 that define a plurality of central axis for the plurality of gripping mechanisms 440. Several gripping mechanisms 440 populate a single chuck 410 in addition to the pattern of high precision fiducials 420.

Figure 5A:
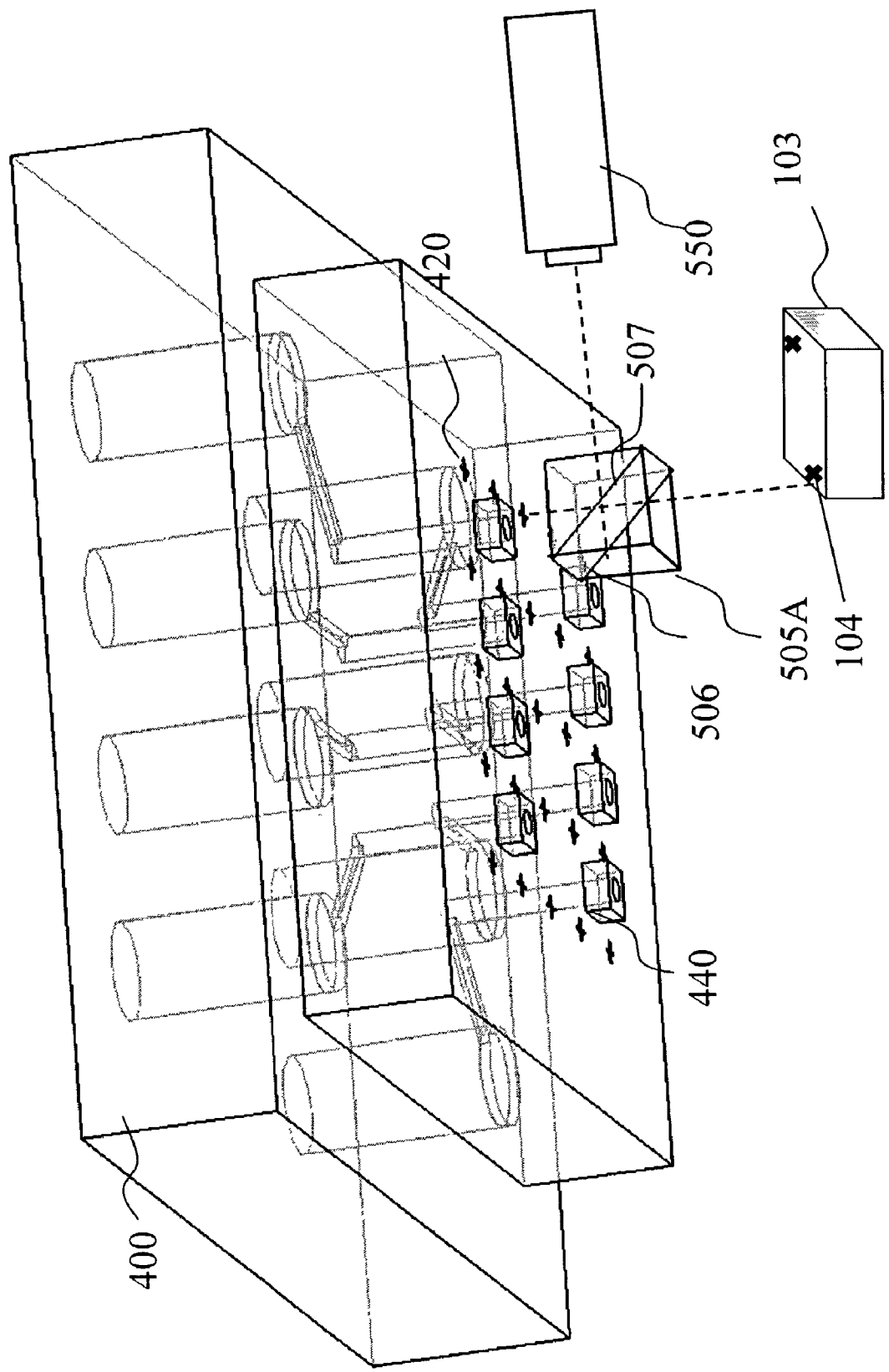
FIG. 5A illustrates a see-through bond head with attached gripping mechanisms suitable for picking and placing several photonic components onto a single substrate, a beamsplitter, and a single die according to an embodiment of the present invention.

The method makes use of an optical probe (beam combiner/splitter) and digital camera, both positioned in a horizontal plane. FIG. 5A illustrates an optical probe with a digital camera mounted in a horizontal plane according to an embodiment of the present invention. The digital camera 550 examines fiducials 420 on the bond head 400, obtained from an upward looking optical path, and compares them to die fiducials 104 on the semiconductor die 103, obtained using a downward looking optical path. The two optical paths are overlayed onto the sensor of the digital camera 550 using the optical probe 505. The optical probe 505 may include a beam splitter 505A having one mirrored face 506 such that a fraction of the light (the image of the fiducial 104 on the die 103) from below is reflected away from the camera 550 by the angled mirrored face 507, into the mirrored face 506, reflecting back toward the camera 550 and passing through the angled mirrored face 507 of the beam splitter 505A. A fraction of the light entering the beam splitter 505A from above (the image of the fiducial 420 on the bond head 400) is reflected 90 degrees by the angled mirrored face 507 of the beam splitter 505A toward the camera 550.

Each die 103 is loaded onto the bond head 400 sequentially, using the die fiducials 104 and fiducials 420 on the bond head 400 located around the bond head gripping mechanism 440, and comparing positions of each set of fiducials (die 104 and bond head 420) in the overlayed images presented to the camera 550. These fiducials (die 104 and bond head 420) may be either in the same field of view, or require movement of the optical probe 505 using stepper motors with high precision encoders to bring the two sets of fiducials (die 104 and bond head 420) into the field of view at different positions of the optical probe 505. Movement of the optical probe 505 may be in any combination of X, Y, or Z directions. Movement of the die 103 relative to the bond head 400 (or vice versa) may also be in any combination of X, Y, or Z directions, motion in each direction being made using stepper motors with sub-micron resolution in position. This movement may also include a rotation stage also controlled by a high-resolution stepper motor. Based on the relative positions of the fiducials (die 104 and bond head 420) measured using the optical probe 505, the die 103 is moved in X, Y, and Z by high-precision stepper motors until it is correctly positioned under the bond head 400 (or vice versa). Once positioned, the optical probe 505 is removed, the die 103 is raised or the bond head 400 is lowered to bring the die 103 onto the gripping mechanism 440 attached to the bond head 400.

Figure 5B:
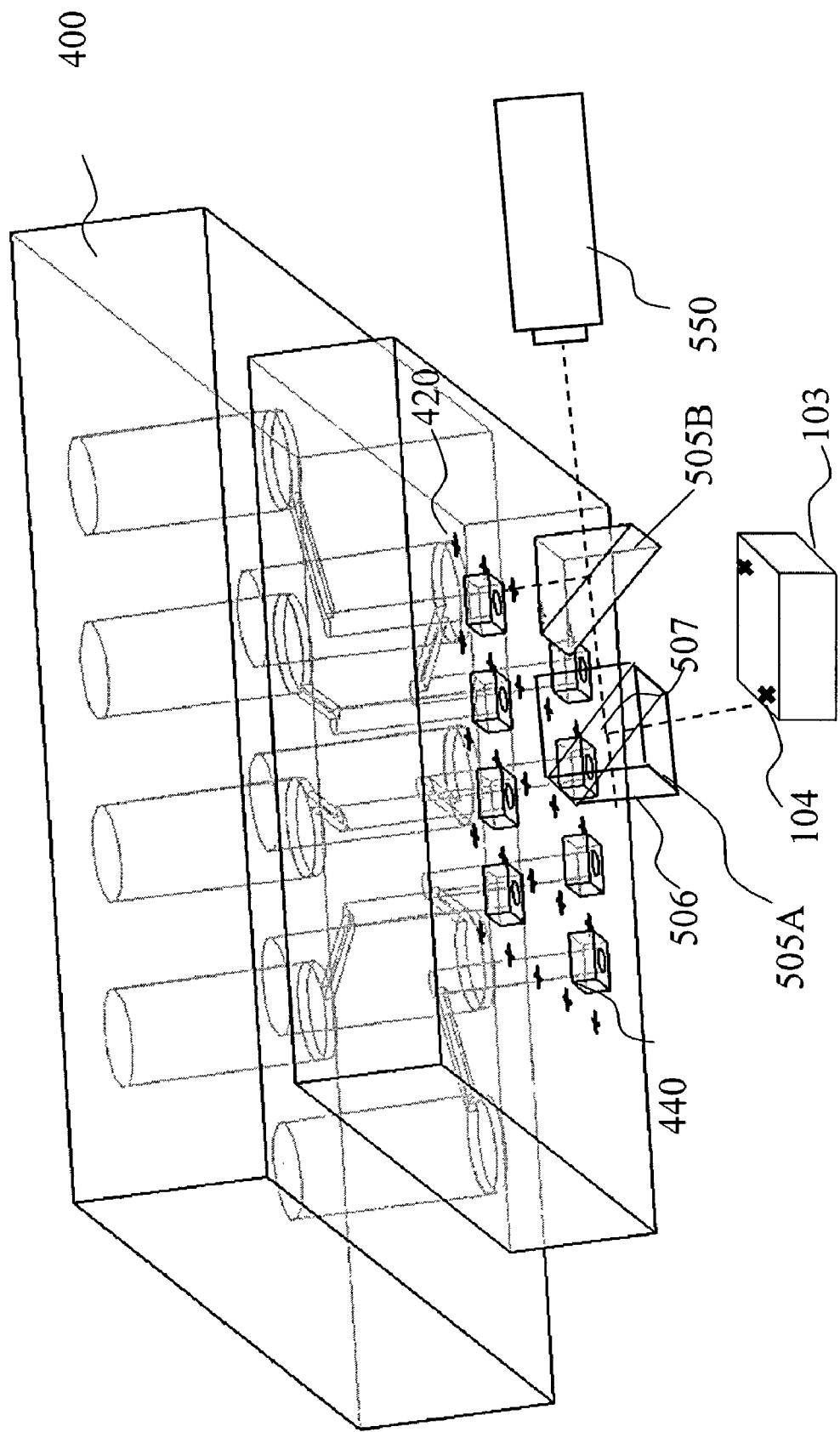
FIG. 5B illustrates a see-through bond head with attached gripping mechanisms suitable for picking and placing several photonic components onto a single substrate, a beamsplitter, a prism, and a single die according to an alternative embodiment of the present invention.

FIG. 5B illustrates an optical probe with a digital camera mounted in a horizontal plane according to an alternative embodiment of the present invention. Highly accurate die placement requires a high powered magnification for the camera 550, causing the field of view of the camera 550 to decrease. Under higher magnification, the fiducials (die 104 and bond head 420) may not be in the same field of view. To view both fiducials (die 104 and bond head 420) simultaneously, optical probe 505 may include beamsplitter 505A and prism 505B. As seen in FIG. 5B, beam splitter 505A has one mirrored face 506 such that a fraction of the light (the image of the fiducial 104 on the die 103) from below is reflected away from the camera 550 by the angled mirrored face 507, into the mirrored face 506, reflecting back toward the camera 550 and passing through the angled mirrored face 507 of the beam splitter 505A. A fraction of the light entering the prism 505B from above (the image of the fiducial 420 on the bond head 400) is reflected 90 degrees by the angled mirrored face 507 of the prism 505B toward the camera 550. If the prism 505B of FIG. 5B were replaced with beamsplitter 505A (as in the embodiment shown FIG. 5A), the downward looking optical path would not see the fiducial 104 on die 103 simultaneously with the bond head fiducial 420.

Figure 6:
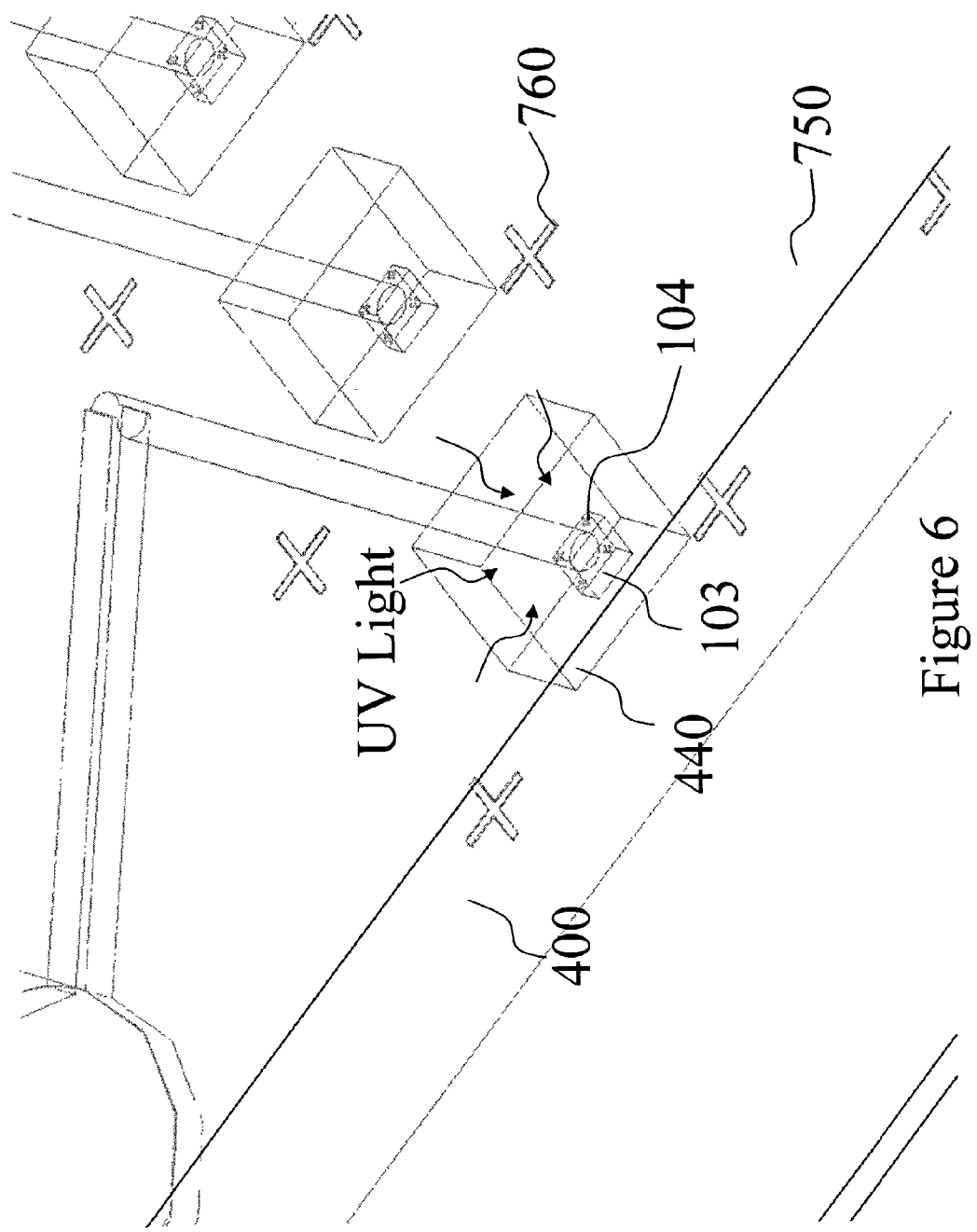
FIG. 6 illustrates an enlarged view of a see-through bond head with attached gripping mechanisms suitable for picking and placing several photonic components onto a single substrate according to an embodiment of the present invention.
Figure 7:
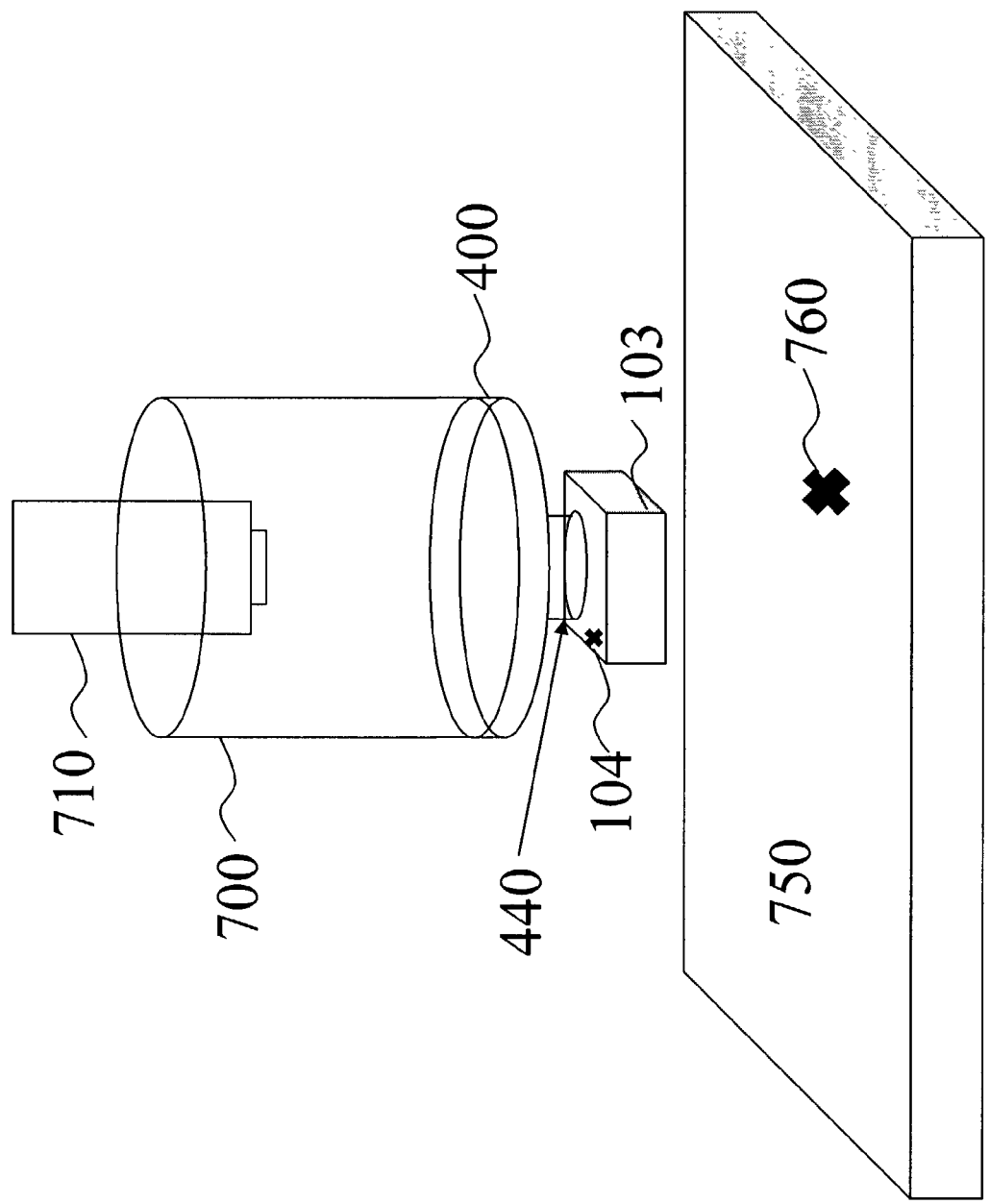
FIG. 7 illustrates a mounting head assembly according to an embodiment of the present invention.

The bonding process makes use of the see-through nature of the bond head 400. Referring to FIG. 6, the fiducials 104 on die 103 may be viewed through the see-through gripping mechanism 440 attached to the ST bond head 400. Fiducials 760 on a substrate 750 may also be viewed through the ST bond head 400. FIG. 7 illustrates a digital camera 710 mounted vertically in the mounting head assembly 700 according to an embodiment of the present invention. For illustrative purposes only, one gripping mechanism 440 of a plurality of gripping mechanisms is shown attached to a circular ST bond head 400. Fiducials 104 on the die 103 are recognized by the downward viewing digital camera 710 and compared with fiducials 760 on the substrate 750 recognized by that same camera 710. These sets of fiducials 104, 760 may also be either in the same field of view, or require movement of the digital camera 710 using stepper motors with high precision encoders to bring the two sets of fiducials 104, 760 into the field of view at different positions of the digital camera 710. Based on the relative positions of the fiducials 104, 760 measured using the optical probe 505, the substrate 750 is moved in the X, Y, and/or Z directions by high-precision stepper motors until it is correctly positioned under the bond head 400 (mounting head assembly 700). The substrate 750 is raised or the bond head 400 (mounting head assembly 700) is lowered to bring the set of die 103 onto the substrate 750, which has been prepared with a small amount of ultra violet (UV) curable epoxy at each die location.

Referring to back to FIG. 6. The bonding process makes use of the UV transparency of both the gripping mechanisms 440 used to lift the die 103, and the bond head 440. As the die 103 are held in place by the gripping mechanisms 440 of the bond head 400, UV light, from a mercury vapor arc lamp emitting near 365 nm for example, is radiated through the bond head 400 and/or gripping mechanisms 440 so that the UV sensitive epoxy used to attach each individual die 103 to the substrate 750 is cured or partially cured at once. This enhances the precision of the die placement following a subsequent thermal cure.

Embodiments of the present invention are utilized in the manufacture of a wavelength division multiplexing (WDM) system to multiplex and de-multiplex several wavelengths/channels of light, wherein WDM transceiver modules are optically optimized for the alignment tolerance of the laser sources and photodetectors. The optimization maximizes the overall alignment tolerance of the optical subassembly with the substrate on which the lasers and photodetectors are attached. The present invention provides a mechanism wherein multiple photonic components may be aligned relative to each other, and then placed and bonded onto a substrate so as to preserve their relative positions with high precision. This technique, along with the specific layout of prisms and lenses, are enabling features for mass production of optical subassemblies and free-space coupled WDM transceiver modules.

Figure 8A:
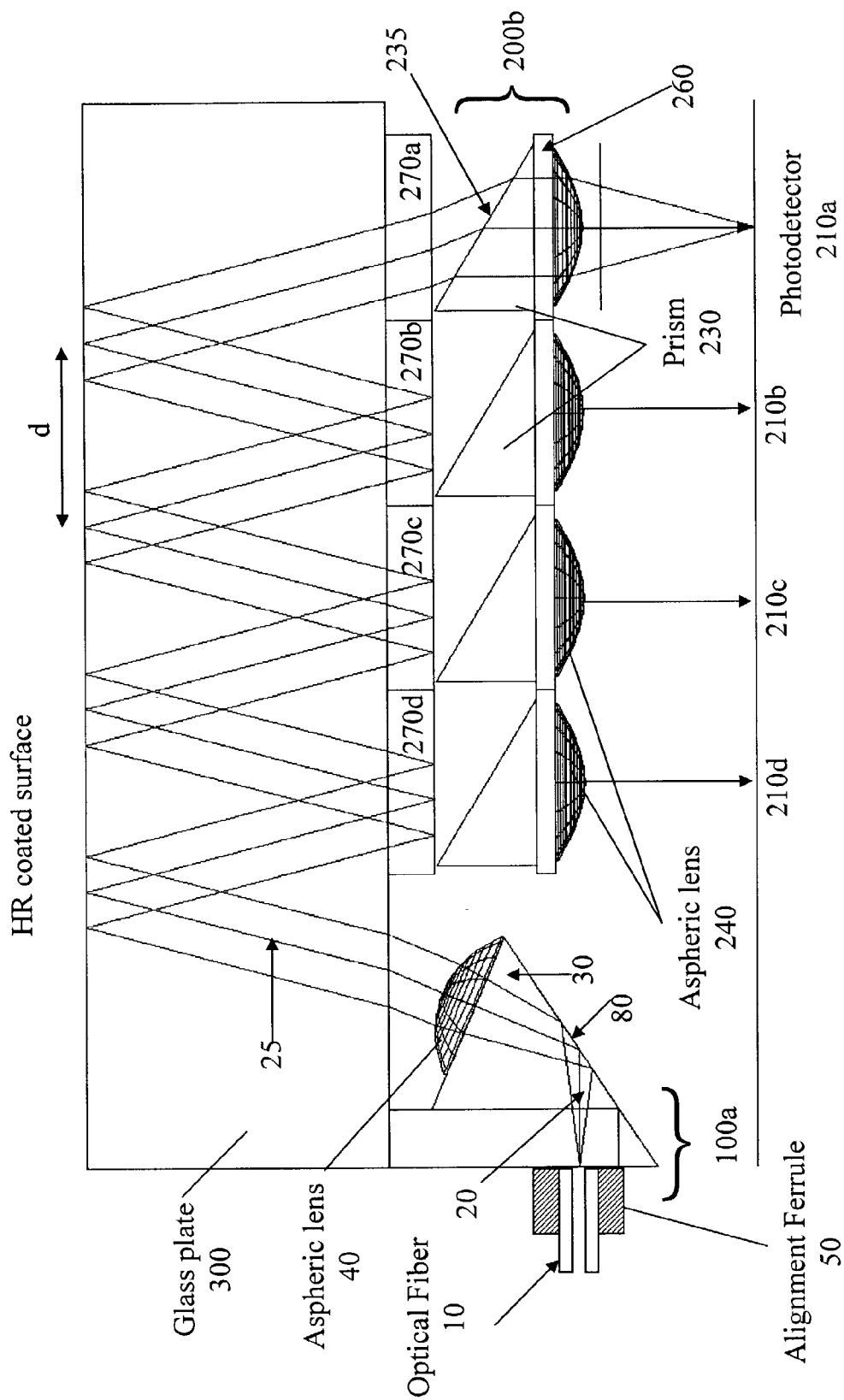
FIG. 8a illustrates a four-channel wavelength division de-multiplexer according to an embodiment of the present invention.
Figure 8B:
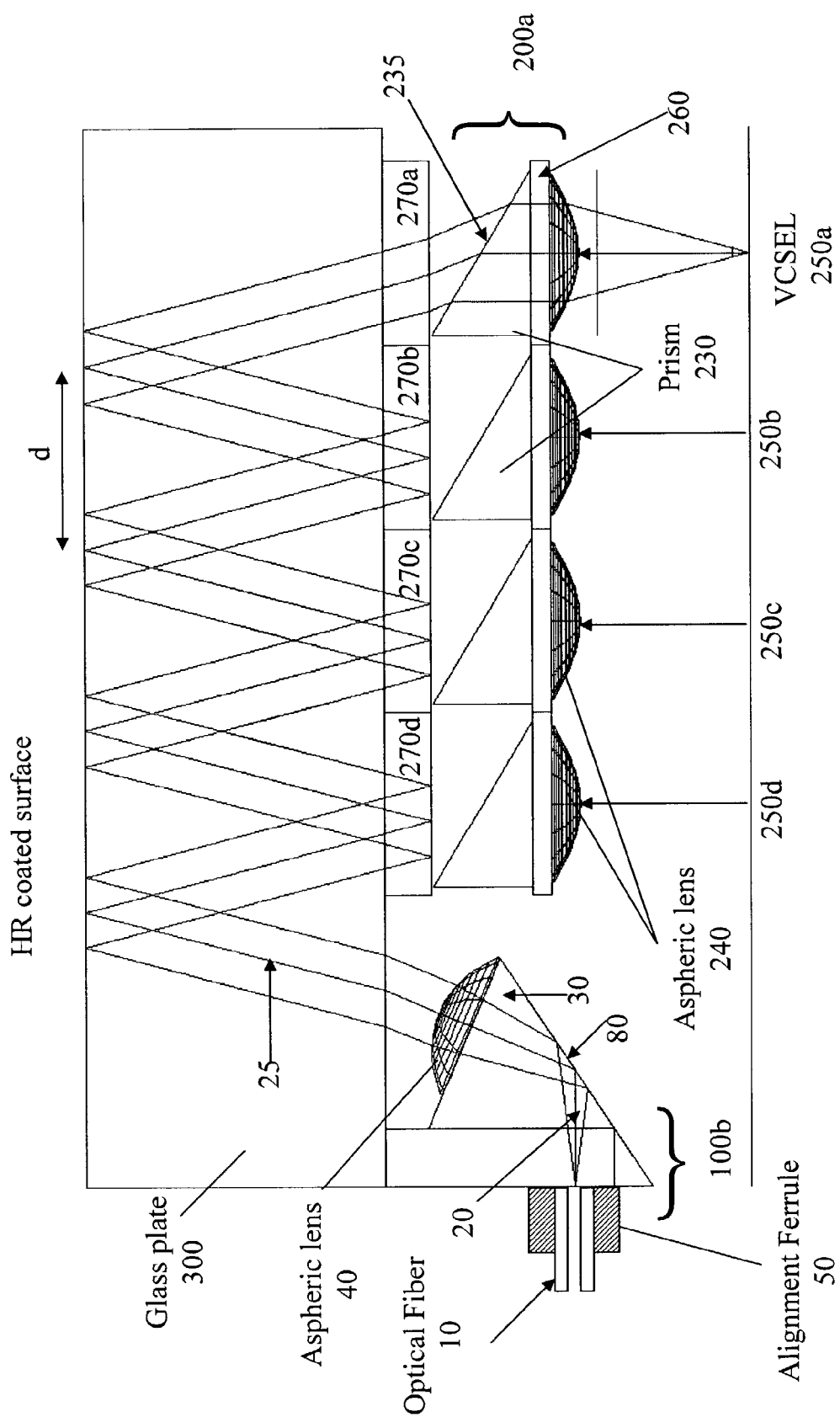
FIG. 8b illustrates a four-channel wavelength division multiplexer according to an embodiment of the present invention.

FIG. 8a and FIG. 8b illustrate schematically designs for a four-channel wavelength division multiplexer/de-multiplexer with a fiber optic input/out according to embodiments of the present invention. The four-channel wavelength division multiplexer/de-multiplexer uses thin film filters (TFFs) in a "zig-zag" scheme to perform channel separation.

FIG. 8a depicts an optical demultiplexer, or a receiver, that consists of an optical subassembly 100a, a glass plate 300, a set of TFFs 270a–270d, a set of focusing optical subassemblies 200b, and a set of photodetectors 210a–210d.

The optical subassembly 100a is a fiber collimator to redirect and collimate an output of a divergent light beam 20 from an optical fiber 10, creating a collimated output 25. The optical subassembly 100a comprises a prism 30, an aspheric lens 40 and an alignment ferrule 50. The optical fiber 10 directs the divergent light beam 20 into the optical subassembly. Prior to collimation, the prism 30, having an index of refraction n, is used to redirect the divergent light beam 20 at a specific angle (φ) relative to the axis normal to the incoming optical axis using total internal reflection (TIR). TIR results as divergent light beam 20 hits a TIR surface 80 of the prism 30.

With the prism 30 and aspheric lens 40, the optical subassembly 100a redirects and collimates a divergent beam from an optical fiber 10 at a specific angle relative to normal to the input axis of the optical fiber 10.

Like the optical subassembly 100a described above, the optical subassembly 200b can be used in reverse to redirect and focus a collimated beam. A collimated beam is incident to a flat, tilted surface 235 of the prism 230 at a specific angle. The optical subassembly 200b, being paraxial in nature, makes use of the flat, tilted surface 235 to redirect the collimated beam and an aspheric lens 240 to focus the beam. This results in a diffraction-limited image being focused onto a photodetector 210a. Since photodetectors utilized for high-speed optical modulation typically have a small active area, efforts to minimize the size of the image are preferred to maximize both the optical energy detected and the tolerance to detector misalignment. With the paraxial optical subassembly 200b, the size of the image is minimized at the photodetector 210a.

In the embodiment, the light beam contains multiple wavelengths, and four focusing optical subassemblies 200b and four TFFs 270a–270d are provided. From the optical subassembly 100a, the collimated, multi-chromatic beam refracts into the glass plate 300, which has a high refractive (HR) coated surface 310 for reflecting the beam. The HR coated surface 310 is coated with a broadband high reflective (HR) coating, and it is coated on the side opposite to the side from which the beam enters. The bandwidth of the HR coating includes the wavelengths to be de-multiplexed. The input angle of the collimated beam is controlled to allow the collimated beam to reflect back-and-forth within the glass plate 300 with a specific spacing d. This is determined by the angle of a TIR surface of the prism 30, the refractive index of the glass plate 300, the refractive index of the TFF substrates 270a–270d, and the thickness of both the glass plate 300 and the TFF substrates 270a–270d.

In the embodiment, each of four TFFs 270a–270d is highly reflective over the same bandwidth as the above-described HR coating surface 310 on the glass plate 300, except within a narrow passband centered at one of the four wavelengths that comprise the input beam. The passband of the TFFs 270a–270d should be wide enough to allow for laser wavelength drift with temperature, manufacturing error, etc. The center wavelengths should be spaced sufficiently far apart, so that negligible overlap exists among the passbands of the TFFs 270a–270d. The width of each of the TFFs 270a–270d used in the embodiment of the present invention shown in FIGS. 8a and 8b may, for example, be 10–15 nm and the spacing may, for example, be 20–25 nm. Further, the design of the multi-layer dielectric structure, used to construct passbands of the TFFs 270a–270d employed in the embodiment, is optimized for the specific angle of incidence expected for the "zig-zag" scheme. This optimization minimizes any variation in reflection and transmission due to the polarization state of the incident light.

In operation, a wavelength component of the collimated beam is shown to propagate back-and-forth within the glass plate 300 of the optical demultiplexer of FIG. 8a. The propagation ends when the collimated beam is incident onto a particular TFF with a bandpass coating that allows the particular wavelength component to pass. As illustrated in FIG. 8a, the TFF 270a is the particular TFF for a particular wavelength component. After passing through TFF 270a, the wavelength component passes through a focusing optical subassembly and is focused onto a photodetector 210a. The photodetector 210a may, for example, be a photodiode. Although not shown for sake of clarity, each of the other wavelength components (not shown) in the input beam passes through a different TFF and is directed and focused onto a different photodetector (210a–210d).

Preferably, a photodetector (210a–210d) is placed with high precision beneath each aspheric lens 240 to detect the wavelength component passing therethrough. Embodiments of the present invention provide a mechanism wherein multiple photodetectors (210a–210d) may be aligned relative to each other, and then placed and bonded onto a substrate so as to preserve their relative positions with high precision.

FIG. 8b depicts a four-channel wavelength optical multiplexer according to an embodiment of the present invention. Light from any one of a vertical cavity surface-emitting laser (VCSEL) 250a–250d is first collimated, then redirected into a "zig-zag" optical path, and finally coupled into an optical fiber 10. The VCSELs 250a–250d are mounted on a line with high precision below the multiplexer. Use of several VCSELs and TFFs having non-overlapping passbands, each centered at the emitting wavelength of its corresponding VCSEL, enables the fabrication of a wavelength division optical multiplexer (WDM). One VCSEL 250a–250d is positioned beneath each aspheric lens 240 to introduce its light beam into the WDM system. For sake of clarity, only one light beam emanating from one VCSEL 250a is shown. The light beam emitted from a VCSEL 250a passes through its corresponding optical assemblies 200a. The light is collimated by the aspheric lens 240 and redirected by the prism 230 into the glass plate 300. Upon entering the glass plate 300, the light beam passes through the TFF 270a. Light beams from other VCSELs 250b–250d enter the glass plate 300 in a similar fashion. Since the TFFs 270a–270d have non-overlapping passbands, different wavelength components are extracted from the light beams. Inside the glass plate 300, light with different wavelength components travels in a "zig-zag" optical path while being reflected by the HR coating 310 and the TFFs 270a–270d. After leaving the glass plate 300, the light with different wavelength components is coupled into an optical fiber 10 by an optical subassembly 100b.

Preferably, a VCSEL 250a–250d is placed with high precision beneath each aspheric lens 240 to couple the light emanating therefrom. Embodiments of the present invention provides a mechanism whereby multiple VCSELs 250a–250d may be aligned relative to each other, and then placed and bonded onto a substrate so as to preserve their relative positions with high precision.

Of importance to the transceiver depicted in FIG. 8a and FIG. 8b is the alignment of the VCSELs 250a–250b and photodetectors 210a–210b to their corresponding aspheric lenses 240. Misalignment often results because of the manufacturing tolerances of optical subassemblies and/or glass plates, thermal expansion, placement accuracy of a die bonder used to position the VCSEL 250 and photodetector 240, etc. Efforts to maximize the amount of light coupled into the optical fiber 10 despite any misalignment of the VCSELs 250a–250d, and/or to maximize the amount of light incident onto the photodetectors 210a–210d despite any misalignment of the photodetector 210a–210d, are necessary to make the transceiver more readily manufactured.

Figure 9:
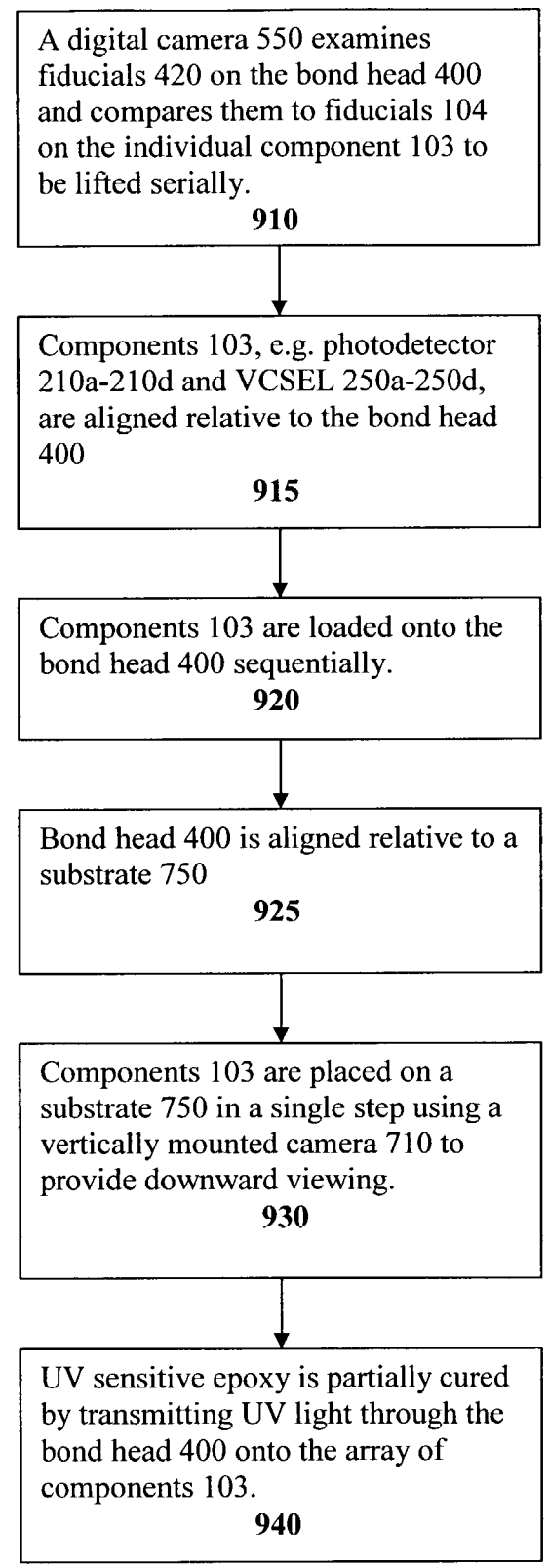
FIG. 9 illustrates a flow chart diagram for implementation of a method of manufacturing a wavelength division multiplexing system according to an embodiment of the present invention.

FIG. 9 illustrates a flow chart diagram for implementation of a method of manufacturing a wavelength division multiplexing system according to an embodiment of the present invention. With reference to FIG. 4, FIG. 5A, FIG. 8A, and FIG. 8B multiple components, for example, photodetectors 210a–210d and VCSELs 250a–250d are serially lifted with high precision onto a see-through bond head 400 using a camera 550 and optical probe 505A mounted in a horizontal plane to provide a simultaneous upward and downward view.

The digital camera 550 examines 910 fiducials 420 on the bond head 400, obtained from an upward looking optical path, and compares 910 them to fiducials 104 on the individual component 103 to be lifted serially, e.g. photodetector 210a–210d and VCSEL 250a–250d, obtained using a downward looking optical path. The two optical paths are overlayed onto the sensor of the digital camera 550 using the optical probe 505. The optical probe 505 may include a beam splitter 505A having one mirrored face 506 such that a fraction of the light (the image of the fiducial 104 on the component 103) from below is reflected away from the camera 550 by the angled mirrored face 507, into the mirrored face 506, reflecting back toward the camera 550 and passing through the angled mirrored face 507 of the beam splitter 505A. A fraction of the light entering the beam splitter 505A from above (the image of the fiducial 420 on the bond head 400) is reflected 90 degrees by the angled mirrored face 507 of the beam splitter 505A toward the camera 550.

Each component 103, e.g. photodetector 210a–210d and VCSEL 250a–250d, is loaded onto the bond head 400 sequentially, using the component fiducials 104 and fiducials 420 on the bond head 400 located around the bond head gripping mechanism 440, and comparing positions of each set of fiducials (component 104 and bond head 420) in the overlayed images presented to the camera 550. These fiducials (component 104 and bond head 420) may be either in the same field of view, or require movement of the optical probe 505 using stepper motors with high precision encoders to bring the two sets of fiducials (component 104 and bond head 420) into the field of view at different positions of the optical probe 505. Movement of the optical probe 505 may be in any combination of X, Y, or Z directions. Movement of the component 103 relative to the bond head 400 (or vice versa) may also be in any combination of X, Y, or Z directions, motion in each direction being made using stepper motors with sub-micron resolution in position. This movement may also include a rotation stage also controlled by a high-resolution stepper motor. Based on the relative positions of the fiducials (component 104 and bond head 420) measured using the optical probe 505, the component 103 is moved in X, Y, and/or Z directions by high-precision stepper motors until it is correctly aligned 915 under the bond head 400 (or vice versa). Once aligned 915, the optical probe 505 is removed, the component 103 is raised or the bond head 400 is lowered to bring the component 103 onto the gripping mechanism 440 attached to the bond head 400. This sequence is repeated until all components 103, e.g. photodetector 210a–210d and VCSEL 250a–250d, are loaded 920 onto the bond head 400.

All the components, e.g. photodetector 210a–210d and VCSEL 250a–250d are placed on to a substrate in a single step using a vertically mounted camera to provide downward viewing. The bonding process makes use of the see-through nature of the bond head 400. Referring to FIG. 4, FIG. 6 and FIG. 7, the fiducials 104 on component 103 may be viewed through the see-through gripping mechanism 440 attached to the ST bond head 400. Fiducials 104 on the component 103 are recognized by the downward viewing digital camera 710 and compared with fiducials 760 on the substrate 750 recognized by that same camera 710. These sets of fiducials 104, 760 may also be either in the same field of view, or require movement of the digital camera 710 using stepper motors with high precision encoders to bring the two sets of fiducials 104, 760 into the field of view at different positions of the digital camera 710. Based on the relative positions of the fiducials 104, 760 measured using the digital camera 710, the substrate 750 is moved in X, Y, and/or Z directions by high-precision stepper motors until it is correctly aligned 925 under the bond head 400. The substrate 750 is raised or the bond head 400 is lowered to place 930 the set of components 103, e.g. photodetector 210a–210d and VCSEL 250a–250d, onto the substrate 750, which has been prepared with a small amount of ultra violet (UV) curable epoxy at each component location.

A curing step, whereby a ultra violet (UV) sensitive epoxy is partially cured 940 by transmitting UV light through the bond head 400 onto the array of components 103, e.g. photodetector 210a–210d and VCSEL 250a–250d while being held in place by the bond head 400. The bond head 400 is then lifted, leaving the array of components positioned with high precision on the substrate 750. Referring to back to FIG. 6, the bonding process makes use of the UV transparency of both the gripping mechanisms 440 used to lift the components 103, and the bond head 440. As the components 103 are held in place by the gripping mechanisms 440 of the bond head 400, UV light, from a mercury vapor arc lamp emitting near 365 nm for example, is radiated through the bond head 400 and/or gripping mechanisms 440 so that the UV sensitive epoxy used to attach each individual components 103 to the substrate 750 is cured or partially cured at once.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. An apparatus adapted for gripping a plurality of objects, the apparatus comprising:
   a mounting head;
   a plurality of suction-operated gripping mechanisms for selectively and independently gripping a plurality of objects positioned adjacent to said gripping mechanisms;
   a suction-operated attachment mechanism for attaching said plurality of gripping mechanisms to said mounting head;
   a viewing mechanism, including a camera, for viewing the plurality of objects gripped by said plurality of gripping mechanisms, said plurality of gripping mechanisms having a light-transmitting portion positioned in such a manner that objects gripped by said plurality of gripping mechanisms can be viewed by said camera through said plurality of gripping mechanisms; and
   a light transmitting vacuum transfer plate mounted to said mounting head, said light transmitting vacuum transfer plate including a plurality of suction channels having a side open towards said plurality of gripping mechanisms such that suction can be selectively and independently applied from a plurality of suction supplies to said plurality of gripping mechanisms via said plurality of suction channels, and an attachment channel in communication with a first suction supply for supplying suction to attach the plurality of gripping mechanisms to the mounting head via the vacuum transfer plate.

2. The apparatus of claim 1, wherein said plurality of suction channels includes a plurality of first suction channels and a plurality of grooves, said plurality of first suction channels are formed through said vacuum transfer plate and communicate with the plurality of grooves, said plurality of first suction channels are in communication with said plurality of suction supplies, and said plurality of grooves have a side open towards said plurality of gripping mechanisms.

3. The apparatus of claim 2, wherein said light-transmitting portions are selectively positioned in the field of view of said camera.

4. The apparatus of claim 3, wherein said plurality of gripping mechanisms are formed on a light transmitting chuck having a plurality of second suction channels through said light-transmitting portion for selectively and independently gripping the plurality of objects in response to application of suction from said plurality of suction supplies through said plurality of second suction channels.

5. The apparatus of claim 4, wherein said plurality of suction supplies communicate with the plurality of first suction channels extending through said vacuum transfer plate, said plurality of first suction channels are arranged in such a manner that when said light transmitting chuck is attached to said light transmitting vacuum transfer plate, said plurality of first suction channels communicate with said plurality of second suction channels via said plurality of grooves for supplying suction to said plurality of second suction channels through said plurality of first suction channels.

6. The apparatus of claim 5, wherein said viewing mechanism includes a second camera and an optical probe for reflecting the image of an object, gripped by any gripping mechanism of said plurality of gripping mechanisms, to the second camera.

7. The apparatus of claim 6, further including an adjusting mechanism for adjusting the orientation of said optical probe so as to properly align with said second camera and with said light-transmitting portion of the gripping mechanism of the plurality of gripping mechanisms.

8. The apparatus of claim 7, wherein said light transmitting chuck has a plurality of fiducials, placed in predefined positions relative to each other, in close proximity to each gripping mechanism of the plurality of gripping mechanisms.

9. The apparatus of claim 8, wherein said optical probe within said viewing mechanism includes a beamsplitter having a first mirrored surface thereby reflecting the image of any of said fiducials on said light transmitting chuck to said second camera simultaneously with the image of any fiducials on an object that are reflected by a second mirrored surface of said beamsplitter to said second camera.

10. The apparatus of claim 9, wherein the images of any fiducial of the plurality of fiducials on the light transmitting chuck and the images of any fiducials on an object may be overlayed on said second camera when said beamsplitter, having said first mirrored surface and said second mirrored surface, is inserted between the object and said light transmitting chuck which directly face each other.

11. The apparatus of claim 8, wherein said optical probe within said viewing mechanism includes a beamsplitter and a prism, said beamsplitter having one mirrored surface thereby reflecting the image of any of said fiducials on an object simultaneously to said second camera with the image of any of said fiducials on said light transmitting chuck reflected by the prism having a reflecting surface to said second camera.

12. The apparatus of claim 11, wherein each gripping mechanism of the plurality of gripping mechanisms, the light transmitting vacuum transfer plate, and the light transmitting chuck are made of a UV transparent material selected from the group consisting of quartz, fused silica, calcium fluoride, or magnesium fluoride.

13. A see-through bond head adapted for gripping a plurality of objects, the see-through bond head comprising:
    a light transmitting vacuum transfer plate;
    a plurality of suction-operated gripping mechanisms for selectively and independently gripping a plurality of objects positioned adjacent to said gripping mechanisms, said plurality of gripping mechanisms having a light-transmitting portion positioned in such a manner that objects gripped by said plurality of gripping mechanisms can be viewed through said plurality of gripping mechanisms; and
    a suction-operated attachment mechanism for selectively and independently gripping the plurality of objects positioned adjacent to said gripping mechanisms, wherein the suction-operated attachment mechanism includes a first suction supply channel for applying suction from a first suction supply for attaching said vacuum transfer plate to a mounting head and a plurality of second suction supply channels for selectively and independently supplying suction from a plurality of second suction supplies to each gripping mechanism of said plurality of gripping mechanisms.

14. The see-through bond head of claim 13, wherein said plurality of second suction supply channels includes a plurality of first suction channels and a plurality of grooves, said plurality of first suction channels are formed through said vacuum transfer plate and communicate with said plurality of grooves, said plurality of first suction channels are in communication with said plurality of second suction supplies, and said plurality of grooves have a side open towards said plurality of gripping mechanisms.

15. The see-through bond head of claim 14, wherein said light-transmitting portions are selectively positioned in the field of view of a camera.

16. The see-through bond head of claim 15, wherein said plurality of gripping mechanisms are formed on a light transmitting chuck having a plurality of second suction channels through said light-transmitting portion for selectively and independently gripping the plurality of objects in response to application of suction from said plurality of second suction supplies through said plurality of second suction channels.

17. The see-through bond head of claim 16, wherein said plurality of second suction channels communicate with the plurality of first suction channels extending through said vacuum transfer plate, said plurality of first suction channels are arranged in such a manner that when said chuck is attached to said vacuum transfer plate, said plurality of first suction channels communicate with said plurality of second suction channels via said plurality of grooves for supplying suction to said plurality of second suction channels through said plurality of first suction channels.

18. The see-through bond head of claim 17, wherein said light transmitting chuck has a plurality of fiducials, placed in predefined positions relative to each other, in close proximity to each gripping mechanism of the plurality of gripping mechanisms.

19. The see-through bond head of claim 18, wherein each gripping mechanism of the plurality of gripping mechanisms is made of a UV transparent material selected from the group consisting of quartz, fused silica, calcium fluoride, or magnesium fluoride.

20. The see-through bond head of claim 19, wherein the light transmitting vacuum transfer plate and the light transmitting chuck are made of a UV transparent material selected from the group consisting of quartz, fused silica, calcium fluoride, or magnesium fluoride.

* * * * *